US010523383B2

(12) United States Patent
Ma et al.

(10) Patent No.: US 10,523,383 B2
(45) Date of Patent: Dec. 31, 2019

(54) SYSTEM AND METHOD FOR GENERATING WAVEFORMS AND UTILIZATION THEREOF

(71) Applicant: Huawei Technologies Co., Ltd., Shenzhen (CN)

(72) Inventors: Jianglei Ma, Ottawa (CA); Ming Jia, Ottawa (CA); Wen Tong, Ottawa (CA); Peiying Zhu, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 697 days.

(21) Appl. No.: 14/822,492

(22) Filed: Aug. 10, 2015

(65) Prior Publication Data

US 2016/0050039 A1 Feb. 18, 2016

Related U.S. Application Data

(60) Provisional application No. 62/038,070, filed on Aug. 15, 2014.

(51) Int. Cl.
| H04L 5/00 | (2006.01) |
| H04J 13/00 | (2011.01) |
| H04L 27/26 | (2006.01) |
| H04L 27/34 | (2006.01) |

(Continued)

(52) U.S. Cl.
CPC .......... *H04L 5/0016* (2013.01); *H03M 13/25* (2013.01); *H04J 13/00* (2013.01); *H04L 27/2615* (2013.01); *H04L 27/2634* (2013.01); *H04L 27/3411* (2013.01); *H04L 27/3416* (2013.01); *H04L 1/004* (2013.01); *H04L 5/0021* (2013.01)

(58) Field of Classification Search
CPC .............. H04L 5/0016; H04L 27/2634; H04L 27/3411; H04L 27/2615; H04L 27/3416; H04L 1/004; H04L 5/0021; H04J 13/00; H03M 13/25
See application file for complete search history.

(56) References Cited

U.S. PATENT DOCUMENTS 7,535,975 B1 5/2009 Ten Brink et al.
7,583,747 B1 9/2009 Damen et al.
(Continued)

FOREIGN PATENT DOCUMENTS

CN 101282152 A 10/2008
CN 101414898 A 4/2009
(Continued)

OTHER PUBLICATIONS

Nikopour et al, sparce code multiple access, Huawei Technologies Canada Co., LTD, IEEE, Nov. 2013, 5 pages.*
(Continued)

*Primary Examiner* — Mounir Moutaouakil
(74) *Attorney, Agent, or Firm* — Slater Matsil, LLP

(57) ABSTRACT

A method for transmitting a waveform includes adjusting first multiplexing parameters of a first multi-carrier waveform to meet communications requirements of a communications system, generating a first signal in accordance with a first input bit block and a first modulation map, placing the first signal in a first subband, wherein the first subband is specified in accordance with the first adjusted multiplexing parameters, and transmitting the first subband.

30 Claims, 10 Drawing Sheets

(51) Int. Cl.
*H03M 13/25* (2006.01)
*H04L 1/00* (2006.01)

(56) References Cited

U.S. PATENT DOCUMENTS

| | | | |
|---|---|---|---|
| 7,839,941 B2* | 11/2010 | Shattil | H04B 1/7174 375/260 |
| 8,125,884 B1 | 2/2012 | Li et al. | |
| 8,208,855 B2* | 6/2012 | Lee | H04L 27/2608 455/63.1 |
| RE45,230 E | 11/2014 | Giannakis et al. | |
| 9,166,663 B2 | 10/2015 | Bayesteh et al. | |
| 9,240,853 B2 | 1/2016 | Nikopour et al. | |
| 9,509,379 B2* | 11/2016 | Taherzadeh Boroujeni | H04B 7/0456 |
| 9,843,434 B2* | 12/2017 | Kim | H04L 5/0048 |
| 10,050,758 B2* | 8/2018 | Seo | H04L 5/0005 |
| 2002/0126773 A1 | 9/2002 | Brunel | |
| 2002/0127982 A1* | 9/2002 | Haapoja | H03D 3/009 455/130 |
| 2003/0039321 A1 | 2/2003 | Lee et al. | |
| 2004/0029586 A1 | 2/2004 | Laroia et al. | |
| 2005/0141644 A1 | 6/2005 | Sadowsky | |
| 2005/0220203 A1 | 10/2005 | Ojard | |
| 2005/0286663 A1 | 12/2005 | Poon | |
| 2006/0159195 A1 | 7/2006 | Ionescu et al. | |
| 2007/0268977 A1 | 11/2007 | Wang et al. | |
| 2009/0097582 A1 | 4/2009 | Barsoum et al. | |
| 2009/0285332 A1 | 11/2009 | Damen et al. | |
| 2009/0323642 A1* | 12/2009 | Tanno | H04B 1/7075 370/336 |
| 2010/0046658 A1 | 2/2010 | Yosoku et al. | |
| 2010/0195759 A1* | 8/2010 | Gaal | H04B 7/0617 375/295 |
| 2010/0265841 A1* | 10/2010 | Rong | H04L 5/0023 370/252 |
| 2011/0044400 A1 | 2/2011 | Collings et al. | |
| 2011/0110316 A1* | 5/2011 | Chen | H04W 72/042 370/329 |
| 2011/0135020 A1 | 6/2011 | Au-Yeung et al. | |
| 2011/0222627 A1 | 9/2011 | Prakash et al. | |
| 2012/0027113 A1 | 2/2012 | Gaal et al. | |
| 2012/0039279 A1* | 2/2012 | Chen | H04L 1/1861 370/329 |
| 2012/0039369 A1 | 2/2012 | Choi et al. | |
| 2012/0039402 A1 | 2/2012 | Clerckx et al. | |
| 2012/0057646 A1 | 3/2012 | Jovicic et al. | |
| 2012/0134338 A1* | 5/2012 | Ko | H04L 5/0048 370/330 |
| 2012/0136912 A1 | 5/2012 | Kim et al. | |
| 2012/0177011 A1 | 7/2012 | Xi et al. | |
| 2012/0257579 A1* | 10/2012 | Li | H04B 7/0626 370/328 |
| 2013/0037429 A1 | 2/2013 | Samoff et al. | |
| 2013/0121437 A1 | 5/2013 | Wang et al. | |
| 2013/0136203 A1 | 5/2013 | Chen et al. | |
| 2013/0170584 A1 | 7/2013 | Geile | |
| 2013/0230119 A1 | 9/2013 | Dhakal et al. | |
| 2013/0237261 A1 | 9/2013 | Bazzi et al. | |
| 2013/0251058 A1 | 9/2013 | Wu et al. | |
| 2014/0140360 A1* | 5/2014 | Nikopour | H04J 13/00 370/479 |
| 2014/0161209 A1 | 6/2014 | Limberg | |
| 2014/0169408 A1* | 6/2014 | Bayesteh | H04B 7/0473 375/144 |
| 2014/0269642 A1* | 9/2014 | Forenza | H04J 11/003 370/337 |
| 2014/0362804 A1 | 12/2014 | Han et al. | |
| 2014/0369434 A1* | 12/2014 | Taherzadehboroujeni | H04B 7/0456 375/261 |
| 2015/0043540 A1* | 2/2015 | Nikopour | H04J 11/00 370/335 |
| 2015/0049706 A1* | 2/2015 | Lee | H04L 5/0057 370/329 |
| 2015/0051904 A1 | 2/2015 | Kikuiri et al. | |
| 2015/0156045 A1* | 6/2015 | Lee | H04L 27/2613 375/260 |
| 2015/0282185 A1* | 10/2015 | Nikopour | H04L 1/0002 370/329 |
| 2015/0295629 A1 | 10/2015 | Xia et al. | |
| 2015/0333860 A1* | 11/2015 | Rahn | H04L 27/0008 398/34 |
| 2015/0365263 A1* | 12/2015 | Zhang | H04L 1/0057 375/295 |
| 2016/0043783 A1 | 2/2016 | Xia et al. | |
| 2016/0049999 A1 | 2/2016 | Taherzadeh Boroujeni et al. | |
| 2017/0366230 A1* | 12/2017 | Pande | H04B 3/542 |

FOREIGN PATENT DOCUMENTS

| | | |
|---|---|---|
| CN | 101917365 A | 12/2010 |
| CN | 102075487 A | 5/2011 |
| CN | 102130752 A | 7/2011 |
| CN | 102149209 A | 8/2011 |
| CN | 102232319 A | 11/2011 |
| EP | 1895511 A1 | 3/2008 |
| EP | 2385671 A2 | 11/2011 |
| EP | 2429083 A1 | 3/2012 |
| JP | 2008533820 A | 8/2008 |
| JP | 2012506662 A | 3/2012 |
| JP | 2013207337 A | 10/2013 |
| JP | 2016501470 A | 1/2016 |
| JP | 2016506143 A | 2/2016 |
| WO | 2006007148 A1 | 1/2006 |
| WO | 2007035993 A1 | 4/2007 |
| WO | 2013064835 A2 | 5/2013 |
| WO | 2014075637 A1 | 5/2014 |
| WO | 2014090189 A1 | 6/2014 |
| WO | 2014123926 A1 | 8/2014 |

OTHER PUBLICATIONS

Taherzadeh et al, SCMA Codebook Design, Huawei Technologies Canada Co., LTD, IEEE, Nov. 2013, 5 pages.*

Payaswini et al, Analysis of Effect of Cyclic Prefix on Data Rates in OFDM Modulation Techniques, 6 pages, Feb. 8, 2012 (Year: 2012).*

International Search Report of Patent Coorperation Treaty (PCT), International Application No. PCT/CN2015/086784, Applicant Huawei Technologies Co., Ltd., dated Nov. 11, 2015, 11 pages.

Taherzadeh, M., et al. "SCMA Codebook Design," Vehicular Technology Conference (VTC Fall), Sep. 14-17, 2014, pp. 1-5.

Hoshyar, et al., "LDS-OFDM an Efficient Multiple Access Technique," 2010 IEEE 71st Vehicular Technology Conference, Jan. 1, 2010, 5 pages.

Nikopour, et al., "Sparse Code Multiple Access," 2013 IEEE 24th International Symposium on Personal, Indoor and Mobile Radio Communications: Fundamentals and PHY Track, Sep. 8, 2013, 5 pages.

Taherzadeh, et al., "SCMA Codebook Design," 2014 IEEE 80th Vehicular Technology Conference, Sep. 14, 2014, 5 pages.

Hoshyar, R., et al., "Novel Low-Density Signature for Synchronous CDMA Systems Over AWGN Channel," IEEE Transactions on Signal Processing, vol. 56, No. 4, Apr. 2008, 12 pages.

Boutros, J., et al., "Good Lattice Constellations for Both Rayleigh Fading and Gaussian Channels," IEEE Transactions On Information Theory, vol. 42, No. 2, Mar. 1996, pp. 502-518.

Viterbo, E., et al., "A Universal Lattice Code Decoder for Fading Channels," IEEE Transactions On Information Theory, vol. 45, No. 5, Jul. 1999, pp. 1639-1642.

Forney, Jr., D. G., "Coset Codes—Part I: Inroduction and Geometrical Classification," IEEE Transaction on Information Theory, vol. 34, No. 5, Sep. 1988, pp. 1123-1151.

Forney, Jr., D. G., "Coset Codes—Part II: Binary Lattices and Related Codes," IEEE Transactions on Information Theory, vol. 34, No. 5, Sep. 1988, 1152-1187.

(56) References Cited

OTHER PUBLICATIONS

Boutros, J., et al., "Signal Space Diversity: A Power-and Bandwidth-Efficient Diversity Technique for the Rayleigh Fading Channel," IEEE Transactions On Information Theory, vol. 44, No. 4, Jul. 1998, pp. 1453-1467.

Ungerboeck, G., "Channel Coding with Multilevel/Phase Signals", IEEE Transactions on Information Theory, vol. IT-28, No. 1, Janurary 1982, 13 pages.

Iran, N.H., et al., "Multidimensional Subcarrier Mapping for Bit-Interleaved Coded OFDM With Iterative Decoding", IEEE Transactions on Signal Processing, Dec. 2007, pp. 5772-5781, vol. 55, No. 12.

* cited by examiner

SYSTEM AND METHOD FOR GENERATING WAVEFORMS AND UTILIZATION THEREOF

This application claims the benefit of U.S. Provisional Application No. 60/441,080, filed on Aug. 15, 2014, entitled "System and Method for Zero Peak-to-Average Power Ratio Waveforms and Utilization Thereof," which application is hereby incorporated herein by reference.

TECHNICAL FIELD

The present disclosure relates generally to digital communications, and more particularly to a system and method for generating waveforms and utilization thereof.

BACKGROUND

SCMA is a non-orthogonal multiple access scheme that allows multiple devices, users, or user equipments (UEs) to share channel resources. Potential transmit devices are allocated time and frequency resources, also referred to as resource units. In SCMA, potential transmit devices are also assigned a sparse codebook that allows superposition of device transmissions, which allows SCMA systems to support more connected devices.

SUMMARY OF THE DISCLOSURE

Example embodiments of the present disclosure which provide a system and method for generating waveforms and utilization thereof.

In accordance with another example embodiment of the present disclosure, a method for transmitting a waveform is provided. The method includes adjusting, by a transmitting device, first multiplexing parameters of a first multi-carrier waveform to meet communications requirements of a communications system, and generating, by the transmitting device, a first signal in accordance with a first input bit block and a first modulation map. The method includes placing, by the transmitting device, the first signal in a first subband, wherein the first subband is specified in accordance with the first adjusted multiplexing parameters, and transmitting, by the transmitting device, the first subband.

In accordance with another example embodiment of the present disclosure, a method for operating a receiving device is provided. The method includes determining, by the receiving device, multiplexing parameters, and receiving, by the receiving device, a first subband in accordance with the multiplexing parameters. The method includes extracting, by the receiving device, a first signal from the first subband, and processing, by the receiving device, the first signal in accordance with a first modulation map associated with the receiving device.

In accordance with another example embodiment of the present disclosure, a transmitting device is provided. The transmitting device includes a processor, and a non-transitory computer readable storage medium storing programming for execution by the processor. The programming including instructions to adjust first multiplexing parameters of a first multi-carrier waveform to meet communications requirements of a communications system, generate a first signal in accordance with a first input bit block and a first modulation map, place the first signal in a first subband, wherein the first subband is specified in accordance with the first adjusted multiplexing parameters, and transmit the first subband.

In accordance with another example embodiment of the present disclosure, a receiving device is provided. The receiving device includes a processor, and a non-transitory computer readable storage medium storing programming for execution by the processor. The programming including instructions to determine multiplexing parameters, receive a first subband in accordance with the multiplexing parameters, extract a first signal from the first subband, and process the first signal in accordance with a first modulation map associated with the receiving device.

One advantage of an embodiment is that zero or substantially zero PAPR waveforms simplify analog-to-digital and digital-to-analog converter design, as well as increase efficiency of radio frequency power amplifiers.

Another advantage of an embodiment is that co-existence of zero or substantially zero PAPR waveforms and non-zero PAPR waveforms is enabled, thereby allowing the support of different sub-carrier spacings and/or symbol durations.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

Figure 1:
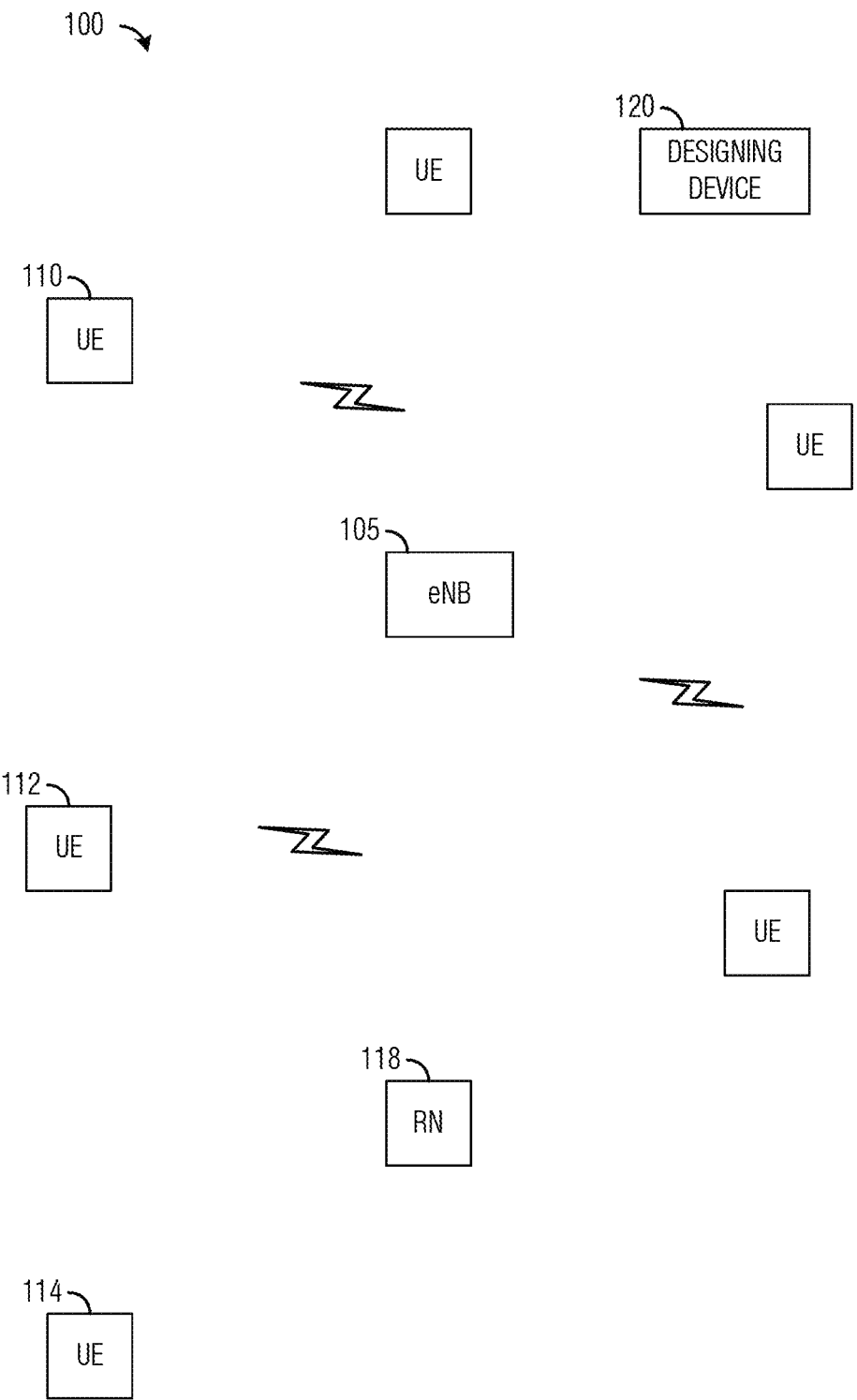
FIG. 1 illustrates an example communications system according to example embodiments described herein.

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

One embodiment of the disclosure relates to generating waveforms. For example, a designing device generates multi-dimensional constellation maps with each constellation map having non-zero constellation points and a zero constellation point, equalizes non-zero constellation points of the multi-dimensional constellation maps, wherein the non-zero constellation points comprise the constellation points excluding the zero constellation point, labels the constellation points of the multi-dimensional constellation maps so that for an input bit block value there is a single multi-dimensional constellation map with a non-zero constellation point associated therewith, and prompts the multi-dimensional constellation maps to be used for communicating signals in a communications system.

The present disclosure will be described with respect to example embodiments in a specific context, namely communications systems that generate and use zero or substantially zero PAPR waveforms. The disclosure may be applied to standards compliant communications systems, such as those that are compliant with Third Generation Partnership Project (3GPP), IEEE 802.11, and the like, technical standards, and non-standards compliant communications systems, that generates and uses zero or substantially zero PAPR waveforms. In some embodiment, offset within a reasonable amount, like 5%, can be consider as substantially zero.

In SCMA, data is spread over multiple time-frequency resource units, for example tones of orthogonal frequency division multiple access (OFDMA) resources through multi-dimensional codewords. In other SCMA variants, the data may be spread over resource units of code division multiple access (CDMA), single carrier waveforms, filter bank multicarrier (FBMC), filtered OFDM, discrete Fourier transform spread OFDM (DFT spread OFDM), and the like. Sparsity of codewords helps to reduce the complexity of joint detection of multiplexed SCMA layers by using message passing algorithm (MPA). In general, each layer of SCMA signal has its specific codebook set. Low density spreading (LDS) is a special case of SCMA. LDS as a form of multi-carrier CDMA (MC-CDMA) is used for multiplexing different layers of data. As opposed to SCMA with multi-dimensional codewords, LDS uses repetitions of the same (QAM) symbol on layer-specific nonzero position in time or frequency. As an example, in LDS-orthogonal frequency division multiplexing (LDS-OFDM) a constellation point is repeated (with some possible phase rotations) over nonzero frequency tones of a LDS block. The shaping gain and coding gain of multi-dimensional constellations is one of the advantages of SCMA over LDS. The gain is potentially high for higher order modulations where the repetition coding of LDS shows a large loss and poor performance.

SCMA is an encoding technique that encodes data streams, such as binary data streams, or in general, M-ary data streams, where M is an integer number greater than or equal to 1 into multidimensional codewords. SCMA directly encodes the data stream into multidimensional codewords and circumvents quadrature amplitude modulation (QAM) symbol mapping, which may lead to coding gain over conventional CDMA (and LDS) encoding. Notably, SCMA encoding techniques convey data streams using a multidimensional codeword rather than a QAM symbol. SCMA uses a SCMA codebook to encode the data stream into multidimensional codewords, the SCMA codebook is an example of a spread constellation. The spread constellation, which may also be referred to as a spread modulation map, is achieved by applying a spreading sequence to a constellation. The constellation may also be referred to as a modulation map. The spreading sequence may also be referred to as a signature.

Additionally, SCMA encoding provides multiple access through the use of different codebooks for different multiplexed layers, as opposed to the use of different spreading sequences for difference multiplexed layers, e.g., a LDS signatures in LDS, as is common in conventional CDMA encoding. Furthermore, SCMA encoding typically uses codebooks with sparse codewords that enable receivers to use low complexity algorithms, such as message passing algorithms (MPA), to detect respective codewords from combined codewords received by the receiver, thereby reducing processing complexity in the receivers.

CDMA is a multiple access technique in which data symbols are spread out over orthogonal and/or near orthogonal code sequences. Traditional CDMA encoding is a two-step process in which a binary code is mapped to a quadrature amplitude modulation (QAM) symbol before a spreading sequence is applied. While traditional CDMA encoding can provide relatively high data rates, new techniques/mechanisms for achieving even higher data rates are needed to meet the ever-growing demands of next-generation wireless networks. Low density spreading (LDS) is a form of CDMA used for multiplexing different layers of data. LDS uses repetitions of the same symbol on layer-specific nonzero position in time or frequency. As an example, in LDS-orthogonal frequency division multiplexing (OFDM) a constellation point is repeated (with some possible phase rotations) over nonzero frequency tones of a LDS block. Sparse code multiple access (SCMA) is a codebook-based non-orthogonal multiplexing technique realized by super-imposing of multi-dimensional codewords selected from SCMA codebooks, which are examples spread modulation maps. Instead of spreading of QAM symbols as in LDS, coded bits are directly mapped to multi-dimensional sparse complex codewords. The major benefit of SCMA codebooks is the shaping gain and coding gain of multi-dimensional constellations over repetition coding of LDS spreading. SCMA is classified as a waveform/modulation and multiple access scheme. SCMA codewords are laid over multiple channel resource units, for example multi-carrier tones of OFDM. In SCMA overloading is achievable with moderate complexity of detection thanks to the sparseness of SCMA codewords. SCMA can show noticeable gain over LDS especially for larger constellation sizes where the gain of multi-dimensional modulation is potentially larger. Even though LDS may show poor link performance for larger constellation orders, it provides system advantages due to its spreading and overloading capabilities. Interference whitening, open-loop user multiplexing and massive connectivity are some examples showing the benefit of LDS from system point of view. SCMA is a spreading and multiplexing technique that offers all the system benefits of LDS, while it maintains or even improves the link performance in comparison with OFDMA. Therefore, SCMA brings the link advantages of OFDMA and system advantages of LDS all altogether.

FIG. 1 illustrates an example communications system 100. Communications system 100 may support SCMA communications. Communications system 100 may include an evolved NodeB (eNB) 105 operating as a communications controller. Communications system 100 may also include user equipment (UE), such as UE 110, UE 112, and UE 114. eNB 105 may include multiple transmit antennas and multiple receive antennas to facilitate multiple input multiple output (MIMO) operation, wherein a single eNB (or transmit node) may simultaneously transmit multiple data streams to multiple users, a single user also with multiple receive antennas, or a combination thereof. Similarly, the UEs may include multiple transmit antennas and multiple receive antennas to support MIMO operation. In general, an eNB may also be referred to as a communications controller, a NodeB, a base station, a controller, and the like. Similarly, a UE may also be referred to as a mobile station, a mobile, a terminal, a user, a subscriber, and the like. Communications system 100 may also include a relay node (RN) 118 that is capable of utilizing a portion of resources of eNB 105 to help improve coverage and/or overall performance of communications system 100.

A designing device 120 may design zero or substantially zero PAPR waveforms for communications system 100 or a portion thereof. Designing device 120 may adjust communications system parameters of communications system 100 or a portion thereof to generate zero PAPR waveforms for devices in communications system 100. A single zero PAPR waveform may be used by all devices in communications system 100. Different zero PAPR waveforms may be used in different portions of communications system 100. Different zero PAPR waveforms may be used by different communicating devices in communications system 100. It is noted that although shown in FIG. 1 as being a single stand-alone device, in other example embodiments, there may be multiple designing devices, each responsible for a different part of a communications system. Alternatively, designing device 120 may be co-located in other devices in communications system 100. As an example, some or all of the eNBs in communications system 100 may include designing devices.

While it is understood that communications systems may employ multiple eNBs capable of communicating with a number of UEs, only one eNB, one RN, and a number of UEs are illustrated for simplicity.

SCMA-OFDM is a code-domain multiplexing scheme over multicarrier modulation in which the spreading codebooks are sparse and hence detection can be made simpler. Spreading factor, sparsity of codebooks, and number of the maximum SCMA multiplexed layers are communications system parameters indicating the flexibility of the SCMA waveform.

Figure 2:
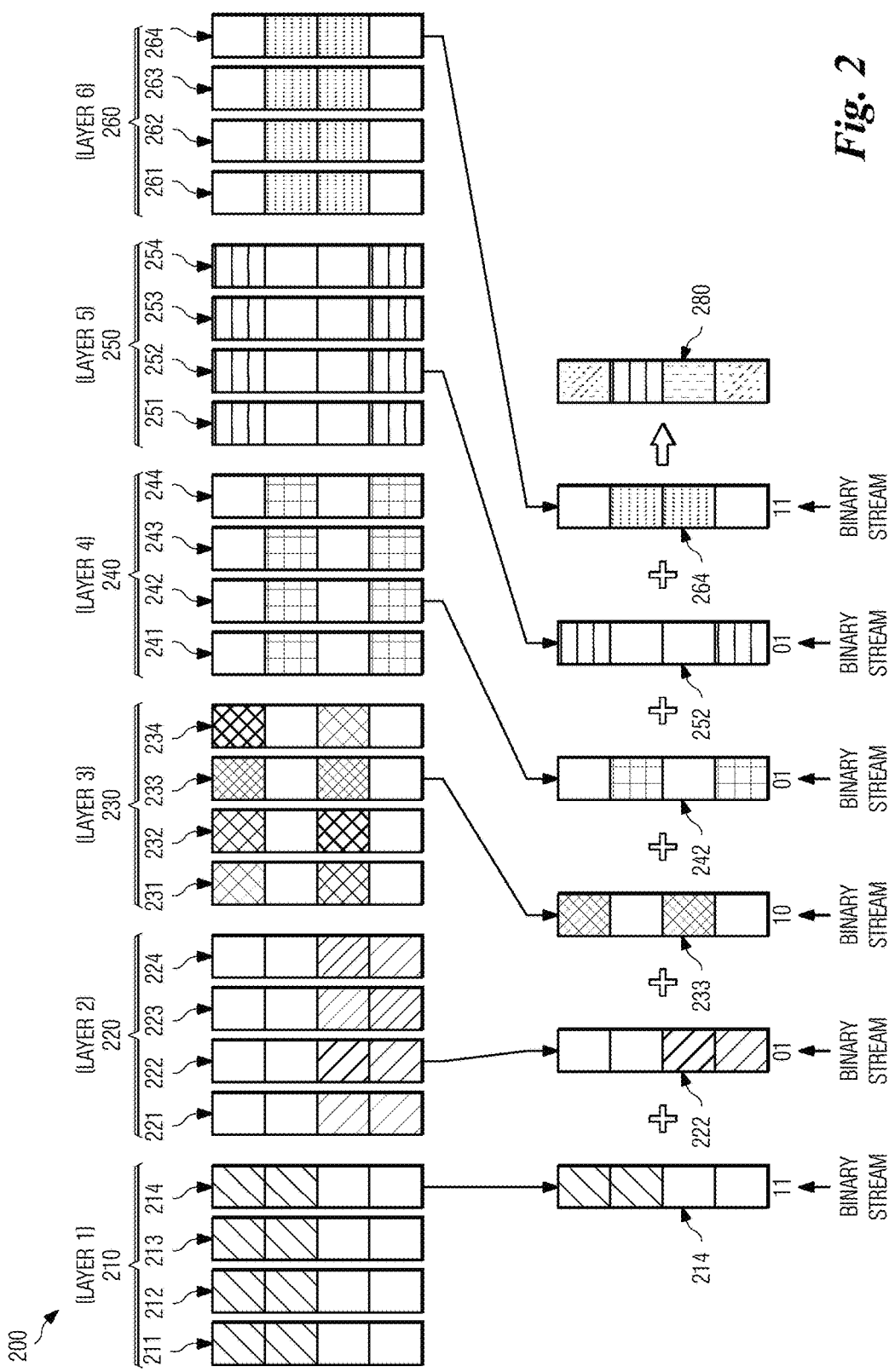
FIG. 2 illustrates an example SCMA multiplexing scheme for encoding data according to example embodiments described herein.

FIG. 2 illustrates an example SCMA multiplexing scheme 200 for encoding data. As shown in FIG. 2, SCMA multiplexing scheme 200 may utilize a plurality of codebooks, such as codebook 210, codebook 220, codebook 230, codebook 240, codebook 250, and codebook 260. Each codebook of the plurality of codebooks is assigned to a different multiplexed layer. Each codebook includes a plurality of multidimensional codewords (or spreading sequences). It is noted that in LDS, the multidimensional codewords degenerate into low density sequence signatures. More specifically, codebook 210 includes codewords 211-214, codebook 220 includes codewords 221-224, codebook 230 includes codewords 231-234, codebook 240 includes codewords 241-244, codebook 250 includes codewords 251-254, and codebook 260 includes codewords 261-264.

Each codeword of a respective codebook may be mapped to a different data, e.g., binary, value. As an illustrative example, codewords 211, 221, 231, 241, 251, and 261 are mapped to binary value '00', the codewords 212, 222, 232, 242, 252, and 262 are mapped to the binary value '01', the codewords 213, 223, 233, 243, 253, and 263 are mapped to the binary value '10', and the codewords 214, 224, 234, 244, 254, and 264 are mapped to the binary value '11'. It is noted that although the codebooks in FIG. 2 are depicted as having four codewords each, SCMA codebooks in general may have any number of codewords. As an example, SCMA codebooks may have 8 codewords (e.g., mapped to binary values '000' . . . '111'), 16 codewords (e.g., mapped to binary values '0000' . . . '1111'), or more.

As shown in FIG. 2, different codewords are selected from various codebooks 210, 220, 230, 240, 250, and 260 depending on the binary data being transmitted over the multiplexed layer. In this example, codeword 214 is selected from codebook 210 because the binary value '11' is being transmitted over the first multiplexed layer, codeword 222 is selected from codebook 220 because the binary value '01' is being transmitted over the second multiplexed layer, codeword 233 is selected from codebook 230 because the binary value '10' is being transmitted over the third multiplexed layer, codeword 242 is selected from codebook 240 because the binary value '01' is being transmitted over the fourth multiplexed layer, codeword 252 is selected from codebook 250 because the binary value '01' is being transmitted over the fifth multiplexed layer, and codeword 264 is selected from codebook 260 because the binary value '11' is being transmitted over the sixth multiplexed layer. Codewords 214, 222, 233, 242, 252, and 264 may then be multiplexed together to form multiplexed data stream 280, which is transmitted over shared resources of a network. Notably, codewords 214, 222, 233, 242, 252, and 264 are sparse codewords, and therefore can be identified upon reception of multiplexed data stream 280 using a low complexity algorithm, such as a message passing algorithm (MPA) or a turbo decoder.

In summary, the SCMA waveform enables non-orthogonal multiple access with enhanced spectrum efficiency, lower latency, lower signaling overhead, and the like. The SCMA waveform also supports overloading where data for multiple users are combined to increase overall data rate and connectivity. The sparsity present in SCMA codewords limits detection complexity. While multi-dimensional codewords allow for shaping gain and coding gain and better spectral efficiency with spreading for robust link-adaptation.

Figure 3:
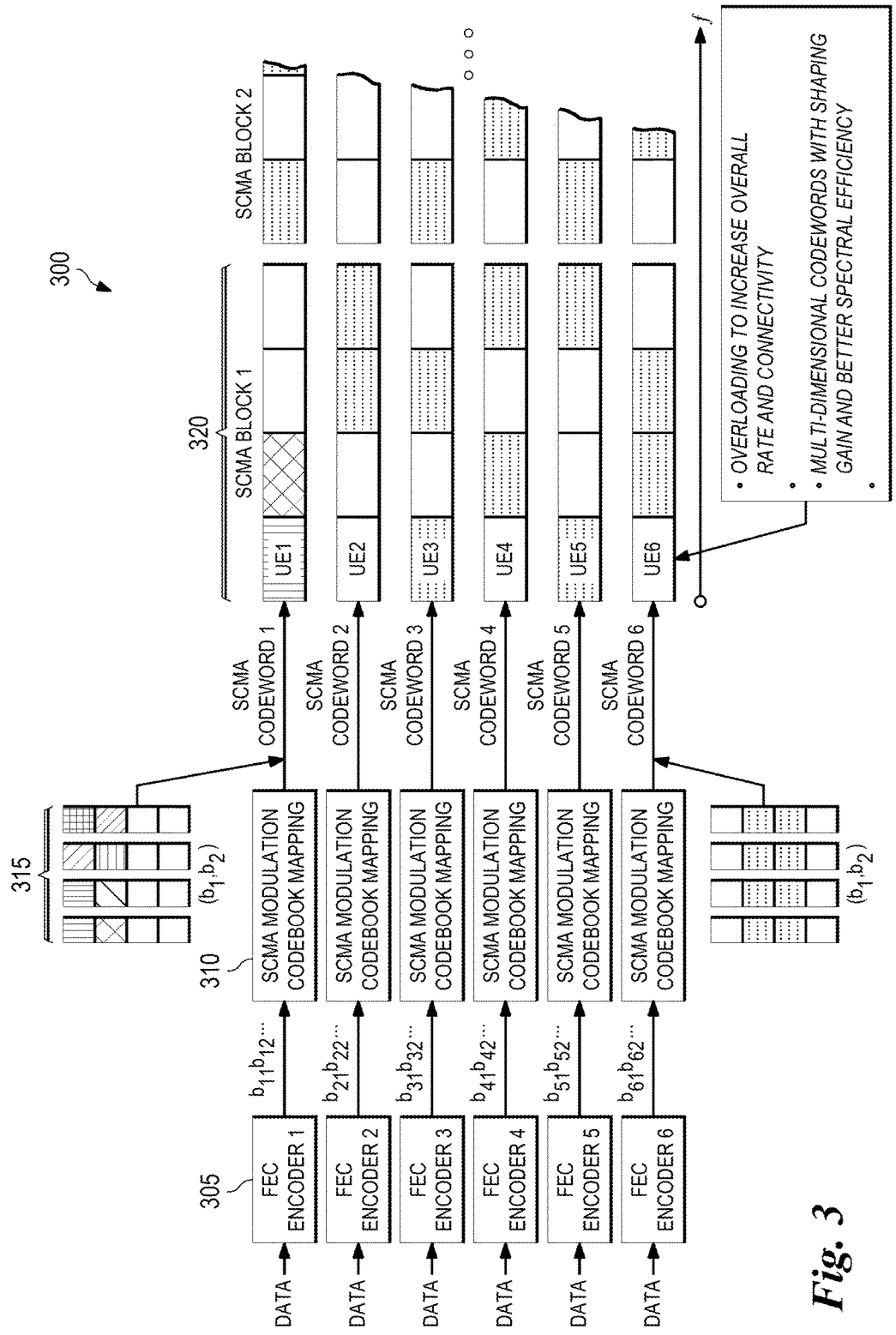
FIG. 3 illustrates an example SCMA waveform and an example process of data being modulated with example SCMA codebooks to fill SCMA blocks according to example embodiments described herein.

FIG. 3 illustrates a diagram 300 of an example SCMA waveform and an example process of data being modulated with example SCMA codebooks to fill SCMA blocks. As discussed previously, SCMA codebooks are examples of spread modulation maps. Data to be transmitted are provided to forward error correcting code (FEC) encoders, such as FEC encoder 305, to produce encoded data for different users. The data for different users is provided to SCMA modulation codebook mapping units, such as SCMA modulation codebook mapping unit 310, to produce SCMA codewords, such as SCMA codewords 315. First SCMA codewords are inserted into SCMA block 320.

The multicarrier nature of SCMA-OFDM and LDS-OFDM, as well as other multicarrier waveforms, such as orthogonal frequency division multiplexing (OFDM), and the like, leads to communications with high PAPR. High PAPR communications generally require transmitters with increased complexity of analog-to-digital converters (ADC) and digital-to-analog converters (DAC), as well as reduced efficiency of radio frequency (RF) power amplifier(s). High PAPR also places a stringent requirement on the RF power amplifier and reduces their efficiency since higher input power backoff factors are needed before the peaks in the signal experience significant distortion due to power amplifier nonlinearity.

The high PAPR issue becomes more severe for millimeter wave (mmW) and Massive Multiple Input Multiple Output (M-MIMO) implementations because the costs of the ADCs and DACs, as well as the power amplifiers are more significant points of concern. Therefore, there is a desire to have zero PAPR (or substantially zero PAPR) SCMA and/or LDS waveforms. As presented herein, zero PAPR waveforms are theoretical goals that may be approached asymptotically in practice. Although the discussion focuses on zero PAPR waveforms, in practice, the resulting waveforms may not actually have a PAPR absolutely equal to 0. Instead, these waveforms may have PAPRs that are sufficiently close to zero to help reduce or eliminate some or all of the problems discussed above. Therefore, the use of the term zero PAPR waveform also applies to substantially zero (low or very low, e.g., within 5% of zero) PAPR waveforms.

According to an example embodiment, zero PAPR waveforms are generated based on zero PAPR codebook(s). The maximum data rate supported is controlled by selection of OFDM parameters.

According to an example embodiment, zero PAPR waveforms are provided for modulation levels higher than quadrature phase-shift keying (QPSK).

According to an example embodiment, a zero PAPR SCMA codebook is presented. The zero PAPR SCMA codebook may include multi-dimensional constellation maps that include the origin (i.e., the zero constellation point). In general, all constellation maps associated with different non-zero components of SCMA codeword have the same number of constellation points with all non-zero constellation points having the same amplitude. Input bit blocks (e.g., outputs of FEC encoders shown in FIG. 3) are mapped to different constellation points in each constellation map for different non-zero components of a SCMA codeword. Example input bit blocks include 2-bit blocks for 4-point modulation, 3-bit blocks for 8-point modulation, 4-bit blocks for 16-point modulation, and the like. Furthermore, for each input block only one constellation map has a non-zero constellation point. In other words, for each input block, there is only one non-zero plane.

Figure 4A:
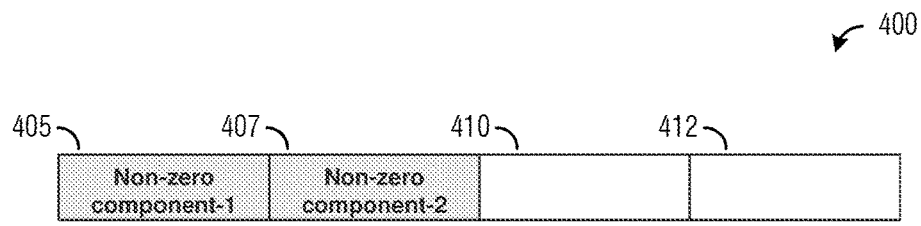
FIG. 4a illustrates an example SCMA codeword for 4-point modulation with 2 non-zero components and 2 zero components according to example embodiments described herein.

FIG. 4a illustrates an example SCMA codeword 400 for 4-point modulation with 2 non-zero components 405 and 407 and 2 zero components 410 and 412. It is noted that the positions of the non-zero components and the zero components may be different for different SCMA codebooks (refer to FIGS. 2 and 3 for other example SCMA codeword configurations for 4-point modulation). It is noted that a non-zero component may be equal to zero or non-zero depending on the value of the 2-bit input block being mapped in different constellation maps. As shown in FIG. 4a, a 2-bit block is mapped to constellation points that are placed in 2 non-zero components 405 and 407, while zero components 410 and 412 are left zero.

Figure 4B:
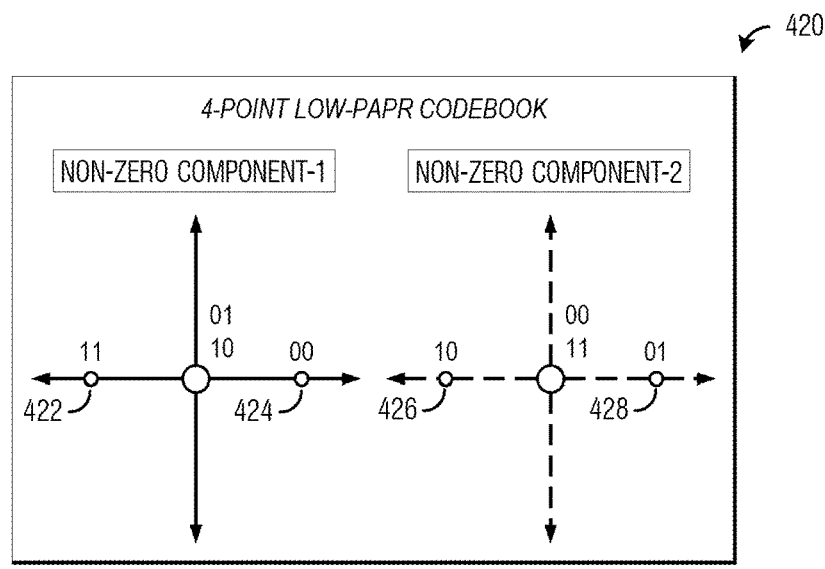
FIG. 4b illustrates an example 4-point low PAPR codebook according to example embodiments described herein.

FIG. 4b illustrates an example 4-point low PAPR codebook 420. A 2-bit block maps to 4 possible points. For a first non-zero component (labeled non-zero component 1, which may be used to fill non-zero component 405 of FIG. 4a), 2-bit block values 01 and 10 map to the origin, while 2-bit block value 11 maps to point 422 and 2-bit block value 00 maps to point 424.

As discussed earlier, in order to achieve zero PAPR, for each input block only one constellation map has a non-zero constellation point. Therefore, if an input block maps to a non-zero value in a first non-zero component, then in other non-zero components (e.g., a second non-zero component in a 2 non-zero component SCMA codeword), the input block maps to zero values. Therefore, for a second non-zero component (labeled non-zero component 2, which may be used to fill non-zero component 407 of FIG. 4a), 2-bit block values 00 and 11 map to the origin (since they mapped to non-zero values in non-zero component 1), while 2-bit block value 10 map to point 426 and 2-bit block value 01 map to point 428.

Figure 4C:
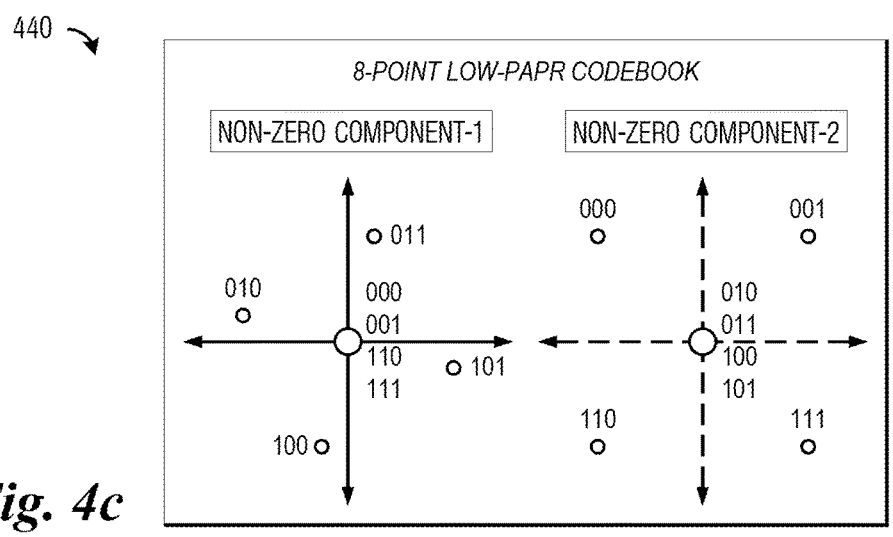
FIG. 4c illustrates an example 8-point low PAPR codebook according to example embodiments described herein.

FIG. 4c illustrates an example 8-point low PAPR codebook 440. A 3-bit block maps to 8 possible points. For a first non-zero component (labeled non-zero component 1), 3-bit block values 000, 001, 110, and 111 map to the origin, while other 3-bit block values map to non-zero points. For a second non-zero component (labeled non-zero component 2), 3-bit block values 010, 011, 100, and 101 map to the origin, while other 3-bit block values map to non-zero points. It is noted that 3-bit block values that map to non-zero points in first non-zero component map to zero points in second non-zero component, and vice versa.

According to an example embodiment, a zero PAPR waveform is formed with SCMA codebooks occupying the entirety of the available bandwidth. In other words, a multi-carrier OFDM based SCMA waveform is used, where the number of subcarriers is adjusted to be equal to the length of the SCMA codeword. In other words, the number of subcarriers is equal to the number of components in the SCMA codewords. Furthermore, the modulation is provided using zero PAPR SCMA codebooks. Such an example embodiment provides for short OFDM bursts and supports higher data rates. Due to the larger subcarrier spacing, the symbol duration is short (which is proportionally reduced with increased subcarrier spacing). This example embodiment is especially applicable in situations with short cyclic prefix (CP).

As an illustrative example, consider a 3GPP LTE compliant communications system, wherein the available bandwidth comprises 500 subcarriers, when the 500 subcarriers are adjusted to 4 subcarriers (the number of subcarriers needed to convey a SCMA codebook with 4 components). Therefore, a single SCMA codeword transmitted in one OFDM symbol can be transmitted in a very short amount of time if the symbol duration of the OFDM symbol is shortened, allowing for increased data rate. The adjustment of OFDM parameters, such as subcarrier spacing, symbol duration, CP, and the like, allows for the meeting of communications system requirements. Examples of communications system requirements may include data rate, symbol duration, subcarrier spacing, CP length, and the like.

Figure 5:
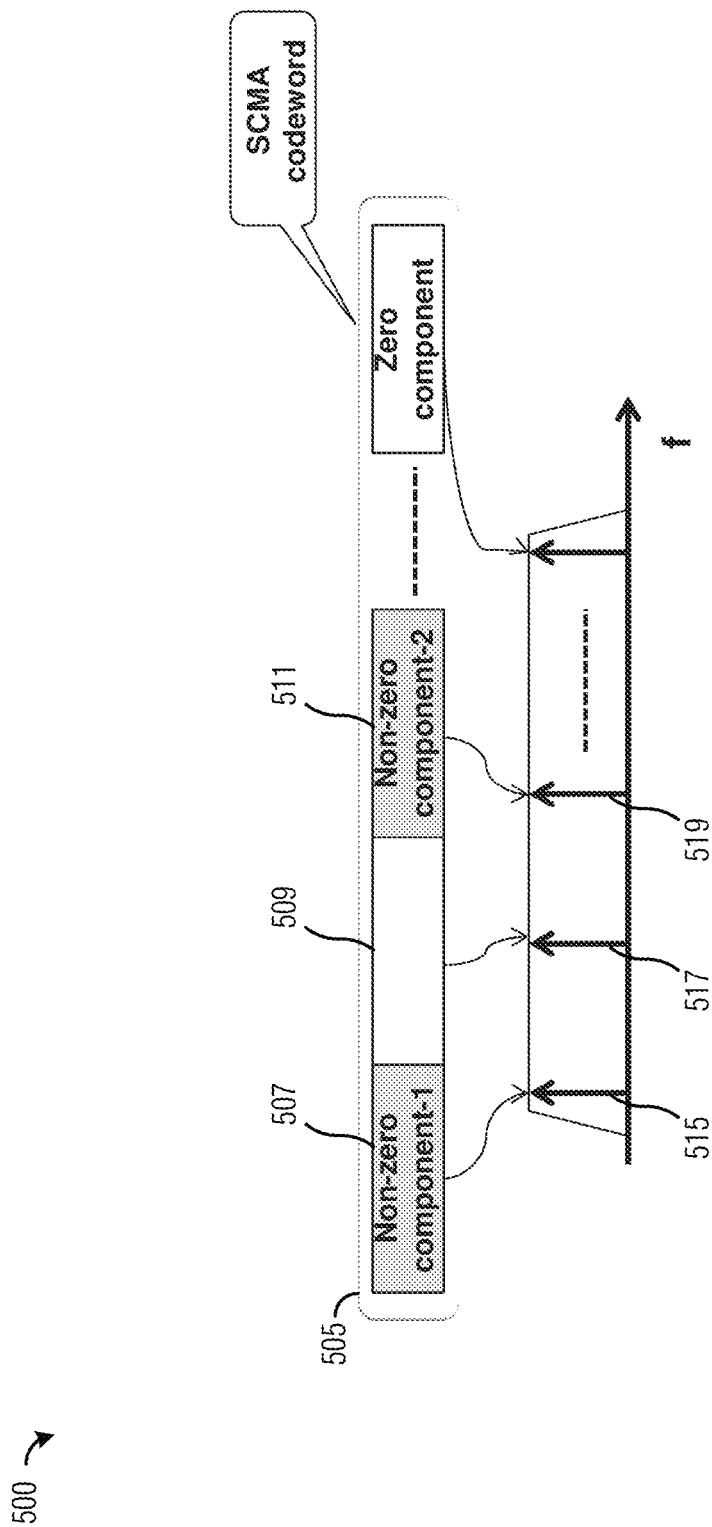
FIG. 5 illustrates a first example waveform where SCMA codebooks occupy the entirety of the available bandwidth of waveform according to example embodiments described herein.

FIG. 5 illustrates a first example waveform 500 where SCMA codebooks occupy the entirety of the available bandwidth of waveform 500. A SCMA codeword 505 is a length N codeword, where N is a positive integer number. Some of the N components of SCMA codeword 505 may be non-zero, such as component 507 and component 511, while some of the N components are always zero, such as component 509. Each of the N components map to a subcarrier in waveform 500. As an example, component 507 maps to subcarrier 515, component 509 maps to subcarrier 517, and component 511 maps to subcarrier 519. Each subcarrier corresponding to a non-zero component of a SCMA codeword is used to transmit a constellation point. It is noted that FIG. 5 illustrates only one SCMA codeword being transmitted in waveform 500. Overloading may be achieved by multiplexing multiple SCMA codewords intended for other users onto waveform 500.

According to an example embodiment, a zero PAPR waveform is formed with SCMA codebooks occupying a subset of the available bandwidth. In order to support a longer CP, subcarrier spacing may be reduced, as an example, the number of subcarriers is reduced but remains greater than the length of a SCMA codeword. One technique that may be used to reduce subcarrier spacing is to increase the number of subcarriers. A multi-carrier OFDM based SCMA waveform is used, where the number of subcarriers is greater than the length of the SCMA codebook or the number of components in the SCMA codebook. In such a situation, data for each user occupies only a portion of the available bandwidth. In this example embodiment, support for longer CP is offset by a reduction in maximum data rate.

Figure 6:
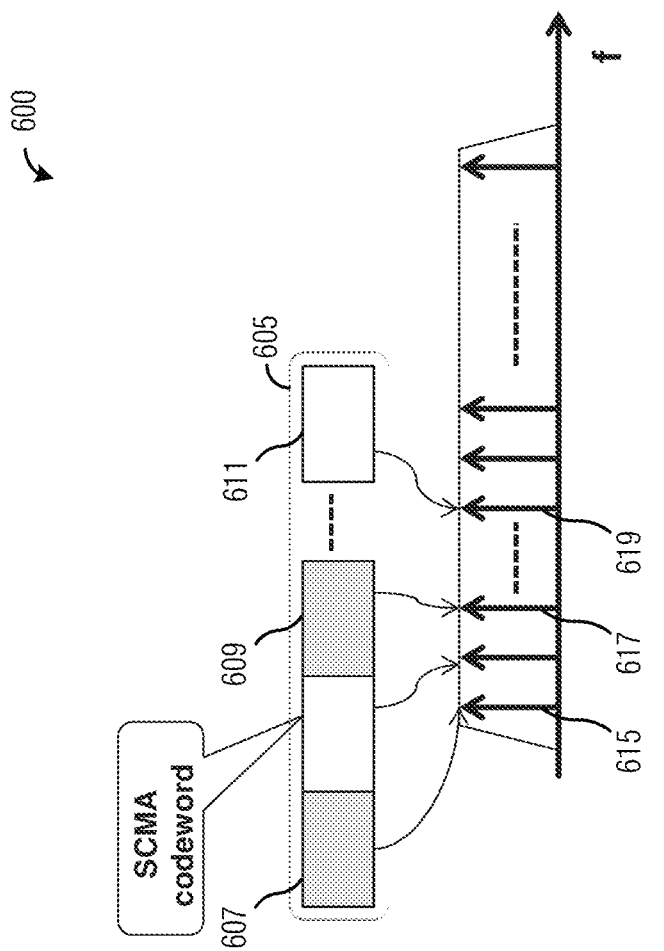
FIG. 6 illustrates a second example waveform where SCMA codebooks occupy a portion of the available bandwidth of waveform according to example embodiments described herein.

FIG. 6 illustrates a second example waveform 600 where SCMA codebooks occupy a portion of the available bandwidth of waveform 600. A SCMA codeword 605 is a length N codeword, where N is a positive integer number. Some of the N components of SCMA codeword 605 may be non-zero, such as component 607 and 609, while some of the N components are always zero, such as component 611. Waveform 600 includes M subcarriers, where M is a positive integer number greater than N. Each of the N components map to a subcarrier in waveform 600. As an example, component 607 maps to subcarrier 615, component 609 maps to subcarrier 617, and component 611 maps to subcarrier 619. Each subcarrier corresponding to a non-zero component of a SCMA codeword is used to transmit a constellation point. Although shown in FIG. 6 as the N components of SCMA codeword 605 being mapped to the first N subcarriers of waveform 600, the N components of SCMA codeword 605 may be mapped to any N subcarriers of waveform 600. As an example, the N components of SCMA codeword 605 may be mapped to any N consecutive subcarriers. As another example, the N components of SCMA codeword 605 may be mapped to any N subcarriers. It is noted that FIG. 6 illustrates only one SCMA codeword being transmitted in waveform 600. Overloading may be achieved by multiplexing multiple SCMA codewords intended for other users onto waveform 600.

According to an example embodiment, a zero PAPR waveform coexists with a non-zero PAPR waveform. Combined with spectrum filtered OFDM (F-OFDM), the zero PAPR waveform can coexist with non-zero PAPR waveforms. The non-zero PAPR waveforms may be used to support communications with users that support or are not so sensitive to high PAPR waveforms, such as high-end devices with more capable ADCs, DACs, power amplifiers, and the like. Higher data rates may require shorter symbol durations, and hence a higher CP overhead. Allowing zero PAPR waveforms and non-zero PAPR waveforms to coexist may allow for a good trade-off between maximum supported data rate and spectrum efficiency. Furthermore, different subcarrier spacing and/or symbol durations may be supported. As an illustrative example, available bandwidth may be partitioned into two parts with a zero PAPR waveform used in a first part and a non-zero PAPR waveform used in a second part. It is noted that the available bandwidth may be partitioned into multiple parts with a first subset of the multiple parts supporting zero PAPR waveforms and a second subset of the multiple parts supporting non-zero PAPR waveforms.

Figure 7:
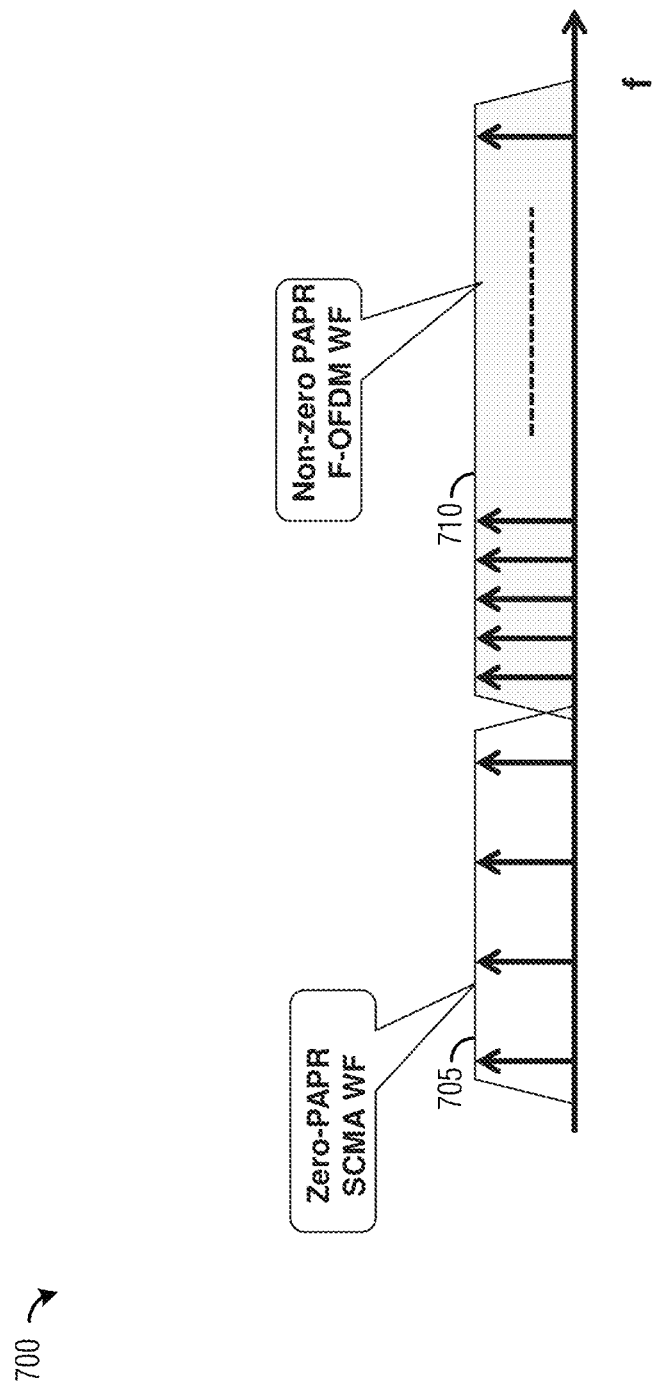
FIG. 7 illustrates an example bandwidth where the available bandwidth of example bandwidth 700 is partitioned into two parts according to example embodiments described herein.

FIG. 7 illustrates an example bandwidth 700 where the available bandwidth of example bandwidth 700 is partitioned into two parts. As shown in FIG. 7, example bandwidth 700 includes a first part 705 and a second part 710. First part 705 is fully or partially occupied by SCMA codebooks associated with a zero PAPR SCMA waveform, while second part 710 is used to support a non-zero PAPR F-OFDM waveform. It is noted that subcarriers of first part 705 may be fully occupied by the SCMA codebooks (such as discussed regarding FIG. 5) or partially occupied by the SCMA codebooks (such as discussed regarding FIG. 6). Again, only one SCMA codeword is being transmitted in first part 705. Overloading may be achieved by multiplexing multiple SCMA codewords intended for other users onto first part 705. The available bandwidth may be partitioned into more than two parts and the parts may be used for different purposes. As an illustrative example, the available bandwidth may be partitioned into three parts, a first part may be used for zero PAPR SCMA waveforms with the number of components being equal to the number of subcarriers, a second part may be used for zero PAPR SCMA waveforms with the number of components being smaller than the number of subcarriers, and a third part may be used for non-zero PAPR F-OFDM waveforms. The parts may differ in subcarriers, bandwidth, and the like. In such a scenario, each part may have associated with it, a filter. As yet another illustrative example, the available bandwidth may be partitioned into a plurality of subbands. Zero PAPR waveforms with different OFDM parameters (such as subcarrier spacing, CP length, and the like) may be supported in different subbands. Subband filters may be used to separate the different subbands with different OFDM parameters. In such a scenario, different zero PAPR waveforms may be supported simultaneously to meet different data rate requirements, while reducing CP overhead that would reduce spectrum efficiency.

Figure 8:
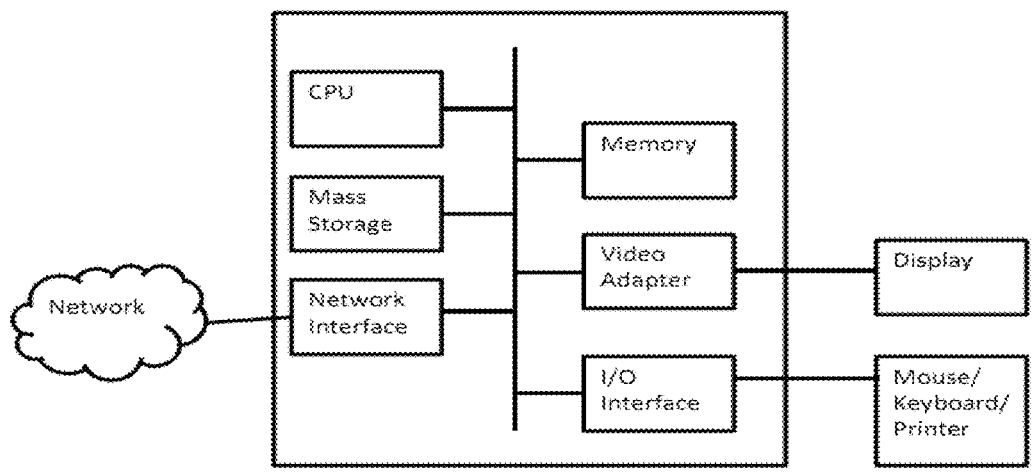
FIG. 8 is a block diagram of an example processing system that may be used for implementing the devices and methods disclosed herein.

FIG. 8 is a block diagram of an example processing system 800 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input/output devices, such as a speaker, microphone, mouse, touchscreen, keypad, keyboard, printer, display, and the like. The processing unit may include a central processing unit (CPU), memory, a mass storage device, a video adapter, and an I/O interface connected to a bus.

The bus may be one or more of any type of several bus architectures including a memory bus or memory controller, a peripheral bus, video bus, or the like. The CPU may comprise any type of electronic data processor. The memory may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

Figure 9A:
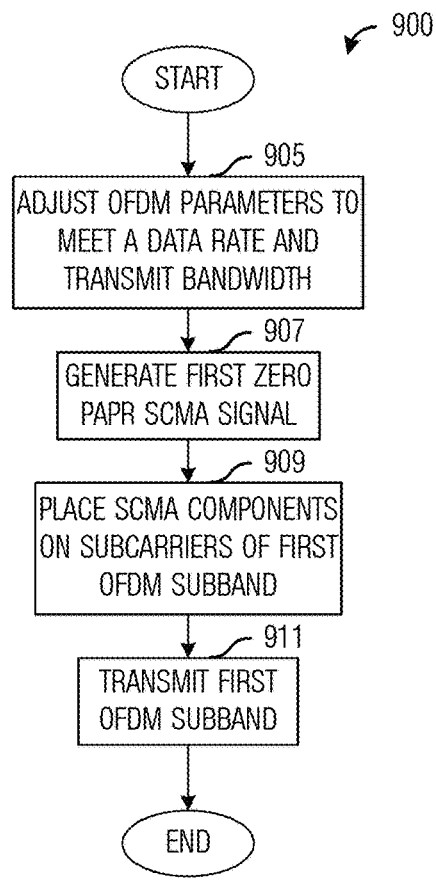
FIG. 9a illustrates a flow diagram of example operations occurring a transmitting device generating and transmitting a zero PAPR waveform according to example embodiments presented herein.

FIG. 9a illustrates a flow diagram of example operations 900 occurring in a transmitting device generating and transmitting a zero PAPR waveform in accordance with example embodiments presented herein.

Operations 900 may begin with the transmitting device determining a transmit bandwidth required by the UE according to its required data rate. The transmitting device may adjust OFDM parameters, such as subcarrier spacing, symbol duration, CP length, and the like, in accordance with the data rate and the transmit bandwidth (block 905). As an illustrative example, the CP length may be determined by transmitting environment, the spectrum range of the carrier frequency, and the like. Alternatively, the transmitting device may select OFDM parameters from a set of OFDM parameters preconfigured by a technical standard, an operator of the communications system, and the like. As an illustrative example, the OFDM parameters (e.g., subcarrier spacing) may be adjusted so that the number of subcarriers is equal to the number of components of the SCMA codebooks. In such a situation, each SCMA transmission occurs over the entirety of the bandwidth. As another illustrative example, the OFDM parameters may be adjusted so that the number of subcarriers is larger than the number of components of the SCMA codebooks. In such a situation, the entirety of the bandwidth is shared by more than one transmitting device. As yet another illustrative example, the OFDM parameters may be adjusted so that a first part of the available bandwidth is used to convey SCMA signals, while a second part of the available bandwidth conveys OFDM signals. According to an alternative example embodiment, a centralized entity, such as an eNB, a designing device, and the like, may adjust the OFDM parameters for transmitting devices operating in the communications system.

The transmitting device may generate a first zero PAPR SCMA signal from a first input bit block and a first zero PAPR SCMA codebook (block 907). The transmitting device may place components of the first zero PAPR SCMA signal on subcarriers of a first SCMA subband (block 909). The transmitting device may transmit the first zero PAPR SCMA signal in the first SCMA subband (block 911). Subband filtering may be needed if different OFDM parameters are used by different subbands.

Figure 9B:
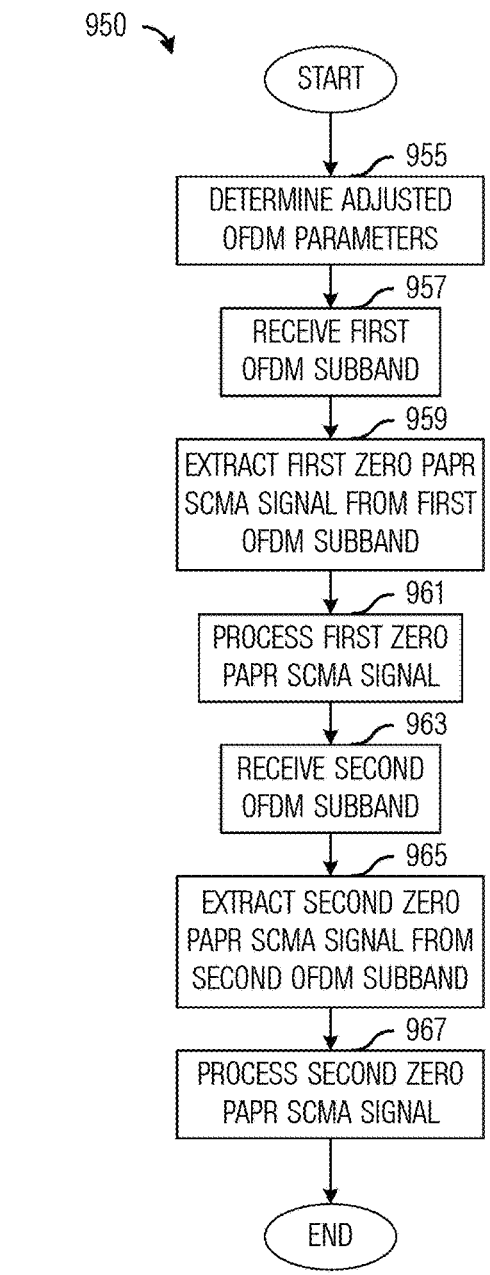
FIG. 9b illustrates a flow diagram of example operations occurring in a receiving device receiving and processing a zero PAPR waveform according to example embodiments presented herein.

FIG. 9b illustrates a flow diagram of example operations 950 occurring in a receiving device receiving and processing a zero PAPR waveform in accordance with example embodiments presented herein.

Operations 950 may begin with the receiving device determining adjusted OFDM parameters (block 955). The adjusted OFDM parameters may be sent to the receiving device in a message. The adjusted OFDM parameters may be retrieved by the receiving device from a memory, a remote memory, a local database, a remote database, and the like. The adjusted OFDM parameters may be preconfigured for the receiving device by a technical standard, an operator of the communications system, and the like.

The receiving device may receive a first OFDM subband (block 957). Receiving the first OFDM subband may include detecting signals corresponding to the available bandwidth. Signal detection may include detection of signals from multiple transmitting devices in the same subband or in different subbands. The receiving device may extract a first zero PAPR SCMA signal from the first OFDM subband (block 959). The receiving device may process the first zero PAPR SCMA signal (block 961). Processing the first zero PAPR SCMA signal may include decoding the first zero PAPR SCMA signal and combining information from multiple zero PAPR SCMA signals. The receiving device may receive a second OFDM subband (block 963). The receiving device may extract a second zero PAPR SCMA signal from the second OFDM subband (block 965). The receiving device may process the second zero PAPR SCMA signal (block 967). The first OFDM subband and the second OFDM subband may be one and the same. Alternatively, the first ODM subband and the second OFDM subband may be different subbands.

Figure 10:
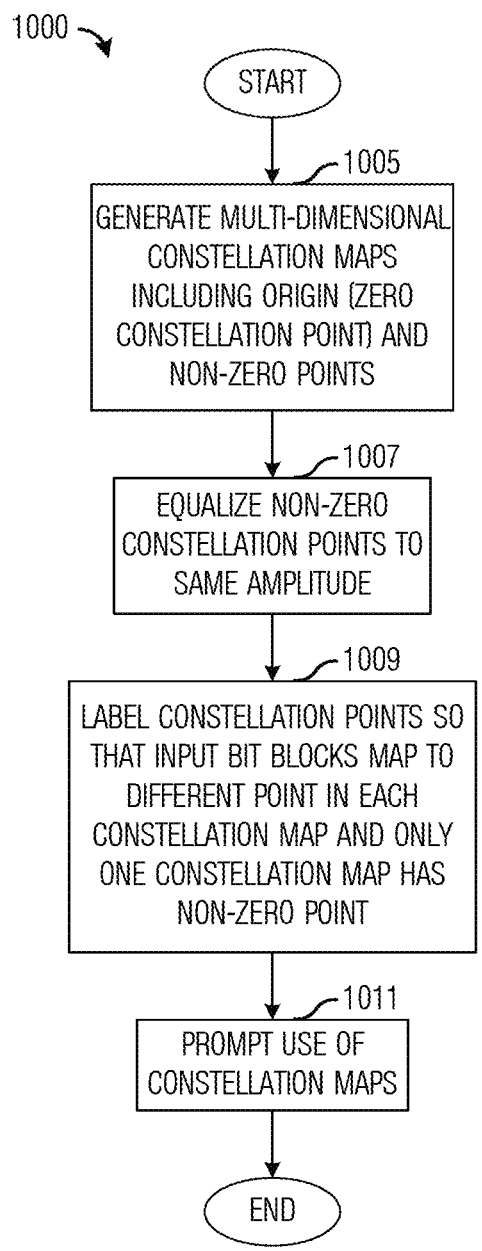
FIG. 10 illustrates a flow diagram of example operations occurring in a designing device generating and storing a zero PAPR waveform according to example embodiments presented herein.

FIG. 10 illustrates a flow diagram of example operations 1000 occurring in a designing device generating and storing zero PAPR codebooks in accordance with example embodiments presented herein.

Operations 1000 may begin with the designing device generating multi-dimensional constellation maps (block 1005). The multi-dimensional constellation maps each include the origin (i.e., the zero constellation point). Furthermore, the multi-dimensional constellation maps include non-zero constellation points. Additionally, in some circumstances (such as when there are two multi-dimensional constellation maps, for example), the multi-dimensional constellation maps include the same number of constellation points. The designing device may equalize the constellation points of the multi-dimensional constellation maps (block 1007). The designing device may equalize the constellation points so that the non-zero constellation points have equal amplitude. The designing device may label the constellation points (block 1009). The designing device may label the constellation points so that for a given input bit block, the values of the given input bit block are mapped to different constellation point in each constellation map. Furthermore, for each input bit block, there is only one constellation map with a non-zero constellation point and remaining constellation maps have all zero constellation points. The designing device may prompt the use of the constellation maps (block 1011). Prompting the use of the constellation maps may include storing the constellation maps. The constellation maps may be stored in a local memory, a remote memory, a local database, a remote database, and the like.

Advantageous features of embodiments may include: a method for generating a zero peak-to-average power ratio (PAPR) codebook. The method includes generating, by a designing device, multi-dimensional constellation maps with each constellation map having non-zero constellation points and a zero constellation point, equalizing, by the designing device, non-zero constellation points of the multi-dimensional constellation maps, wherein the non-zero constellation points comprise the constellation points excluding the zero constellation point, labeling, by the designing device, the constellation points of the multi-dimensional constellation maps so that for an input bit block value there is a single multi-dimensional constellation map with a non-zero constellation point associated therewith, and prompting, by the designing device, the multi-dimensional constellation maps to be used for communicating signals in a communications system. The method could further include, wherein prompting the multi-dimensional constellation maps comprises storing the multi-dimensional constellation maps to a memory. The method could further include, wherein equalizing the non-zero constellation points comprises setting the non-zero constellation to a single amplitude.

Although the present disclosure and its advantages have been described in detail, it should be understood that various changes, substitutions and alterations can be made herein without departing from the spirit and scope of the disclosure as defined by the appended claims.

What is claimed is:

1. A method comprising:
adjusting, by a transmitting device, a first subcarrier spacing of a first multi-carrier waveform to meet a data rate requirement of a communications system based on a first codebook;
generating, by the transmitting device, a first signal in accordance with a first input bit block and the first codebook;
placing, by the transmitting device, the first signal in a first subband, the first subband specified in accordance with the adjusted first subcarrier spacing based on the first codebook; and
transmitting, by the transmitting device, the first signal in the first subband.

2. The method of claim 1, further comprising adjusting first frequency division multiplexing (FDM) parameters.

3. The method of claim 1, wherein the first signal is a first sparse code multiple access (SCMA) signal, and wherein the first codebook is in correspondence with a first SCMA codebook.

4. The method of claim 1, further comprising adjusting the first subcarrier spacing to meet at least one of a symbol duration requirement, or a cyclic prefix (CP) length requirement.

5. The method of claim 1, further comprising adjusting at least one of a first symbol duration, or a first CP length.

6. The method of claim 1, wherein the first multi-carrier waveform comprises an orthogonal frequency division multiplexing waveform.

7. The method of claim 1, wherein the first multi-carrier waveform comprises one of a single carrier frequency division multiple access (SC-FDMA) waveform, a multi-carrier code division multiple access (MC-CDMA) waveform, a filter bank multicarrier (FBMC) waveform, a discrete Fourier transform spread OFDM (DFT spread OFDM) waveform, or a filtered OFDM waveform.

8. The method of claim 1, wherein the first signal comprises N components and the first subband comprises M subcarriers, where N and M are integer values and M is greater than or equal to N.

9. The method of claim 1, further comprising filtering the first subband with a first filter prior to transmitting the first subband.

10. The method of claim 1, further comprising:
adjusting, by the transmitting device, a second subcarrier spacing of a second multi-carrier waveform to meet the data rate requirement;
generating, by the transmitting device, a second signal in accordance with a second input bit block and a second codebook;
placing, by the transmitting device, the second signal in a second subband, the second subband specified in accordance with the adjusted second subcarrier spacing; and
transmitting, by the transmitting device, the second signal in the second subband.

11. The method of claim 10, wherein the first multi-carrier waveform and the second multi-carrier waveform are zero peak to average power ratio (PAPR) waveforms.

12. The method of claim 1, further comprising transmitting a third subband including a non-zero PAPR waveform.

13. The method of claim 12, wherein the non-zero PAPR waveform comprises a filtered OFDM (F-OFDM) waveform.

14. The method of claim 1, wherein the first signal is a zero peak to average power ratio (PAPR) waveform.

15. The method of claim 1, wherein the first subcarrier spacing corresponds to a constellation point in the first codebook, and the first subcarrier spacing is adjusted based on a number of constellation points in the first codebook.

16. The method of claim 1, wherein the first codebook is a sparse codebook.

17. A transmitting device comprising:
a non-transitory memory storage comprising instructions; and
one or more processors in communication with the non-transitory memory storage, wherein the one or more processors execute the instructions to:
adjust a first subcarrier spacing of a first multi-carrier waveform to meet a data rate requirement of a communications system based on a first codebook;
generate a first signal in accordance with a first input bit block and the first codebook;
place the first signal in a first subband, the first subband specified in accordance with the adjusted first subcarrier spacing based on the first codebook; and
transmit the first signal in the first subband.

18. The transmitting device of claim 17, wherein the one or more processors execute the instructions to adjust first frequency division multiplexing (FDM) parameters.

19. The transmitting device of claim 17, wherein the first signal is a first sparse code multiple access (SCMA) signal, and wherein the first codebook is in correspondence with a first SCMA codebook.

20. The transmitting device of claim 17, wherein the one or more processors execute the instructions to adjust the first subcarrier spacing to meet at least one of a symbol duration requirement, or a cyclic prefix (CP) length requirement.

21. The transmitting device of claim 17, wherein the one or more processors execute the instructions to adjust at least one of a first symbol duration, or a first CP length.

22. The transmitting device of claim 17, wherein the first multi-carrier waveform comprises an orthogonal frequency division multiplexing waveform.

23. The transmitting device of claim 17, wherein the first multi-carrier waveform comprises one of a single carrier frequency division multiple access (SC-FDMA) waveform, a multi-carrier code division multiple access (MC-CDMA) waveform, a filter bank multicarrier (FBMC) waveform, a discrete Fourier transform spread OFDM (DFT spread OFDM) waveform, or a filtered OFDM waveform.

24. The transmitting device of claim 17, wherein the first signal comprises N components and the first subband comprises M subcarriers, where N and M are integer values and M is greater than or equal to N.

25. The transmitting device of claim 17, wherein the one or more processors execute the instructions to filter the first subband with a first filter prior to transmitting the first subband.

26. The transmitting device of claim 17, wherein the one or more processors execute the instructions to:

adjust a second subcarrier spacing of a second multi-carrier waveform to meet the data rate requirement;

generate a second signal in accordance with a second input bit block and a second codebook;

place the second signal in a second subband, the second subband specified in accordance with the adjusted second subcarrier spacing; and transmit the second signal in the second subband.

27. The transmitting device of claim 26, wherein the first multi-carrier waveform and the second multi-carrier waveform are zero peak to average power ratio (PAPR) waveforms.

28. The transmitting device of claim 17, wherein the one or more processors execute the instructions to transmit a third subband including a non-zero PAPR waveform.

29. The transmitting device of claim 28, wherein the non-zero PAPR waveform comprises a filtered OFDM (F-OFDM) waveform.

30. The transmitting device of claim 17, wherein the first signal is a zero peak to average power ratio (PAPR) waveform.

* * * * *